United States Patent [19]

Tadano et al.

[11] Patent Number: 4,998,149
[45] Date of Patent: Mar. 5, 1991

[54] STATIC INDUCTION TYPE SEMICONDUCTOR DEVICE

[75] Inventors: Hiroshi Tadano, Nagoya; Tomoyoshi Kushida, Seto, both of Japan

[73] Assignee: Kabushiki Kaisha Toyota Chuo Kenkyusho, Aichi, Japan

[21] Appl. No.: 181,102

[22] Filed: Apr. 13, 1988

[30] Foreign Application Priority Data

Apr. 14, 1987 [JP] Japan .................................. 62-92644

[51] Int. Cl.⁵ ..................... H01L 29/80; H01L 29/10; H01L 29/74; H01L 49/00
[52] U.S. Cl. ......................................... 357/22; 357/38; 357/86; 357/92; 357/23.4
[58] Field of Search ................... 357/22 E, 86, 38, 92, 357/22 D, 23.4

[56] References Cited

U.S. PATENT DOCUMENTS

| 4,270,059 | 5/1981 | Nishizawa et al. | 357/92 |
| 4,450,467 | 5/1984 | Nagano | 357/86 |
| 4,587,547 | 5/1986 | Amemiya | 357/86 |
| 4,635,086 | 1/1987 | Miwa | 357/86 |
| 4,772,926 | 9/1988 | Nishizawa et al. | 357/38 |

FOREIGN PATENT DOCUMENTS

| 55-24434 | 2/1980 | Japan | 357/22 E |
| 55-99772 | 7/1980 | Japan | 357/22 E |

Primary Examiner—Rolf Hille
Assistant Examiner—Wael Fahmy
Attorney, Agent, or Firm—Oblon, Spivak, McClelland, Maier & Neustadt

[57] ABSTRACT

Disclosed is an improvement of a static induction type semiconductor device which includes an anode region provided at one surface portion of a semiconductor substrate, a cathode region provided on the other surface portion, a gate region adjacent to the cathode region and a low impurity density region formed at an intermediate portion of the semiconductor substrate. A cathode short region is provided at a position opposite to the cathode region with the gate region therebetween so as to be conducted to the cathode region, thereby quickening the injection of charge at the time of turn-on and draw up of charge at the time of turn-off, and enabling high-speed on and off operation.

9 Claims, 6 Drawing Sheets

STATIC INDUCTION TYPE SEMICONDUCTOR DEVICE

BACKGROUND OF THE INVENTION

1. Field of the Invention

The present invention relates to a static induction type semiconductor device which is capable of high-speed operation.

2. Description of the Prior Art

A static induction type semiconductor device has conventionally been used as one of the devices which control the conduction and cut-off of current. In a static induction type semiconductor device, there is a time delay in operation when conduction is established (hereinunder referred to as "turn on") or broken (hereinunder referred to as "turn off"). The speed-up of the turn-on and turn-off operations is therefore demanded.

An example of conventional static induction type semiconductor devices will now be explained with reference to FIG. 7.

This example is an n-channel static induction type thyristor, and FIG. 7 shows the sectional structure of two units thereof.

At the upper surface portion of a static induction type thyristor 100, cathode regions 10 consisting of an n-type semiconductor and a gate region 12 consisting of a p-type semiconductor are alternately provided. An anode region 14 consisting of a p-type semiconductor is provided over the entire surface of the lower surface portion of the static induction type thyristor 100. At the intermediate portion of the static induction type thyristor 100 between these upper and lower surface portions is provided a low impurity density region 16.

On the upper surface of the static induction type thyristor 100, first main electrodes 18 which are conducted to the cathode regions 10 and control electrodes 20 which are conducted to the gate regions 12 are provided. An insulator 22 is disposed between the gate region 12 and the first main electrode 18 so as to prevent the conduction therebetween. On the lower surface of the static induction type thyristor 100 is provided a second main electrode 24 which is conducted to the anode region 14.

This kind of the static induction type thyristor 100 can be used as a static induction type thyristor in which conduction is not established when the potentials of the control electrode 20 and the first main electrode 18 are maintained at the same level (hereinunder referred to as "normally-off static induction type thyristor). In this normally-off static induction type thyristor, a predetermined voltage is ordinarily applied between the first main electrode 18 and the second main electrode 24 so as to keep the anode region 14 in a predetermined high potential state with respect to the cathode region 10.

In the case of turn-on operation, the control electrode 20 applies a voltage to the gate region so that the gate region 12 has a positive potential with respect to the cathode region 10, whereby the static induction type thyristor 100 is turned on, and a current flows between the first main electrode 18 and the second main electrode 24.

More specifically, when the gate region 12 comes to have a positive potential, or a slight number of holes are supplied to a channel region 16a from the gate region 12, a large number of electrons are injected from the cathode region 10 to the low impurity density region 16 and further, a large number of holes are injected from the anode region 14 to the low impurity density region 16. Conduction is therefore established between the first main electrode 18 and the second electrode 24, in other words, the static induction type thyristor 100 is turned on. The channel region refers to a portion of the low impurity density region 16 which is below the cathode region 10 and between the gate regions 12.

In the case of cutting off the current which flows between the first main electrode 18 and the second main electrode 24, namely, in the case of turn-off operation, 0 V or a negative potential is applied to the gate region 12. The holes in the channel region 16a are drawn up to the gate region 12, and the injection of electrons from the cathode region 10 to the channel region 16a is stopped, whereby the current between the first main electrode 18 and the second main electrode 24 is cut off.

In the conventional static induction type thyristor 100, when it is in the conductive state, the holes exist at a high density over the entire range of the low impurity density range 16. All of these holes move toward the cathode region 10. Therefore, the density of the holes becomes high in the channel range 16a, namely, a portion of the low impurity density region 16 which is below the cathode region 10 and between the gate regions 12.

In the turn-off operation for cutting off the current between the first main electrode 18 and the second main electrode 24, the holes are drawn up to the gate regions 12. Since a large number of holes exist in the channel region 16a, the current is not cut off until these holes disappear, in other words, until all the holes are corrected by the gate regions 12, which fact makes high-speed cut-off difficult.

Incidentally, the time by which the operation is delayed until the holes disappear in the channel region 16a is referred to as storage time.

In order to cut off the current of such a conventional static induction type thyristor 100 at a high speed, the following measures, for example, have been proposed:

(a) that a life time killer such as gold is added when a substrate for a semiconductor is made;

(b) that the life time of a semiconductor substrate is controlled by projecting electron beams or the like; and, (c) that the structure of the anode region 14 is improved.

However, according to the method of adding a life time killer such as gold and the method of controlling the life time by the projection of electron beams or the like, the number of the holes is reduced so as to enable the speed-up of cutting off operation, but the voltage drop in the conductive state increases, thereby disadvantageously increasing the leakage current in the cut-off state. On the other hand, according to the method of improving the structure of the anode region 16, the reduction in the number of the holes in the channel region 16a is too small to obtain sufficiently high-speed operation at the time of turn-off operation.

SUMMARY OF THE INVENTION

Accordingly, it is an object of the present invention to eliminate the above-described problems in the prior art and to provide a static induction type semiconductor device which is capable of high speed operation in spite of sufficiently small voltage drop in the conductive state.

To achieve this arm, in a first aspect of the present invention, there is provided a static induction type semiconductor device comprising an anode region which consists of a first conductivity type semiconductor and is provided at one surface portion of a semiconductor substrate in such a manner as to be conducted to a second main electrode; a cathode region which consists of a second conductivity type semiconductor and is provided at the other surface portion in such a manner as to be conducted to a first main electrode; a low impurity density region provided at an intermediate region; and a gate region which consists of a first conductivity type semiconductor and is provided adjacently to the cathode region.

In order to reduce the amount of carrier in the low impurity density region in the vicinity of the cathode region, thereby enabling high-speed turn-off operation, a cathode short region is provided at a position opposite to the cathode region with the gate region therebetween. The cathode short region is made of the same first conductivity type semiconductor as the semiconductors of the anode region and the gate region and is short circuited to the cathode region by the first main electrode.

In a second aspect of the present invention, there is provided a static induction type semiconductor device having the same structure as that of the semiconductor device provided in the first aspect and further comprising an anode short region which is provided in the vicinity of the anode region. The anode short region is made of the same second conductivity type semiconductor as the semiconductor of the cathode region and is short circuited to the anode region by the second main electrode.

In a third aspect of the present invention, there is provided a static induction type semiconductor device comprising a drain region of which consists of a second conductivity type semiconductor and is provided at one surface portion of a semiconductor substrate in such a manner as to be conducted to a second main electrode; a source region which consists of a second conductivity type semiconductor and is provided at the other surface portion in such a manner as to be conducted to a first main electrode; a low impurity density region provided at an intermediate region; and a gate region which consists of a first conductivity type semiconductor and is provided adjacently to the source region.

In order to reduce the amount of carrier in the low impurity density region in the vicinity of the source region, thereby enabling high-speed turn-off operation, a source short region is provided at a position opposite to the source region with the gate region therebetween. The source short region is made of the same first conductivity type semiconductor as the semiconductor of the gate region and is short circuited to the source region by the first main electrode.

The operations of the static induction type semiconductor devices provided in the first to third aspects of the present invention will now be explained with reference to an n-channel normally-off type static induction type semiconductor device.

In the static induction type semiconductor device provided in the first aspect of the present invention, when the static induction type semiconductor device is made conductive, namely, in the case of turn-on operation, a voltage is applied to the gate region consisting of the first conductivity type so that the gate region has a positive potential with respect to the cathode region consisting of the second conductivity type. The change in the potential of the gate region causes the electrons to be injected from the cathode region to the low impurity density region, and the injection of the electrons, in turn, causes the holes to be injected from the anode region consisting of the first conductivity type. In this way, the static induction type semiconductor device is turned on.

In this conductive state, a part of the holes injected from the anode region to the low impurity density region flow toward the cathode region. However, since the cathode short region situated opposite to the cathode region with the gate region therebetween is short circuited to the cathode region by the first main electrode so as to maintain the potential of the cathode short region at the same potential as the cathode region, the remaining holes flow toward the cathode short region. In this way, the holes in the low impurity density region are effectively dispersed, so that most of the holes directly flow to the cathode short region without passing through the channel region between the cathode region and the gate region. Therefore, the hole density in the channel region is lowered to a great extent in comparison with that in a conventional static induction type semiconductor device. In addition, since the cathode short region is made of the same first conductivity type semiconductor as that of the anode region, the holes flow out smoothly from the low impurity density region, thereby reducing the hole density in the low impurity density region.

In the turn-off operation, the potential of the gate region is made 0 V or a negative potential with respect to the cathode region. The holes in the channel region are therefore drawn up to the gate region, and since the number of holes is much smaller than that in a conventional device, the injection of the electrons from the cathode region is stopped in a short time.

In the static induction type semiconductor device provided in the first aspect of the present invention, the hole density in the low impurity density range, in particular, in the channel range is small, as described above, so that it is possible to greatly shorten the time required for entering the current cut-off process in the turn-off operation, namely, the storage time, thereby enabling high-speed operation.

The static induction type semiconductor device provided in the second aspect of the present invention has the same structure as that of the semiconductor device provided in the first aspect of the present invention. It is further provided in the vicinity of the anode region consisting of the first conductivity type semiconductor with an anode short region consisting of a different type, namely, the second conductivity type semiconductor. Therefore, not only do the holes quickly disappear from the channel region at the time of turn-off, but also the electrons flow out smoothly from the low impurity density region to the front portion of the anode region, thereby shortening the fall time of the anode current and enabling further speed-up of the operation of the static induction type semiconductor device.

In the static induction type semiconductor device provided in the third aspect of the present invention, in the case of turn-on operation, a voltage is applied to the gate region consisting of the first conductivity type semiconductor device so that the potential thereof becomes positive with respect to the source region consisting of the second conductivity type semiconductor. The holes are therefore supplied from the gate region to the channel region of the low impurity density and the electrons are thereby drawn up from the source region. Thus, the static induction type semiconductor device is turned on.

In this conductive state, since the source short region situated opposite to the source region with the gate region therebetween is short circuited to the source region by the first main electrode so as to maintain the potential of the source short region at the same potential as the source region, the holes injected from the gate region to the low impurity density region are effectively distributed not only to the channel region but also to the vicinity of the low impurity density region, so that the hole density in the channel region is lowered to a great extent in comparison with that in a conventional static induction type semiconductor device. In addition, since the source short region is made of the same first conductivity type semiconductor as that of the gate region, the holes flow out smoothly from the low impurity density region, thereby reducing the hole density in the low impurity density region.

In turn-off operation, the potential of the gate region is made 0 volt or a negative potential with respect to the source region. The holes in the channel region are therefore drawn up to the gate region, and the injection of the electrons from the source region is stopped, thereby breaking the conduction.

In the static induction type semiconductor device provided in the third aspect of the present invention, the hole density in the low impurity density region, in particular, in the channel region is small, as described above, so that it is possible to greatly shorten the storage time, thereby enabling high-speed operation.

Additionally, it is possible to form the static induction type semiconductor devices provided in the first to third aspects of the present invention into a p-channel type static induction type semiconductor device or a normally-on type static induction type semiconductor device. In both cases, it is possible to obtain the same operational effects as those described above.

The above and other objects, features and advantages of the present invention will become clear from the following description of the preferred embodiments thereof, taken in conjunction with the accompanying drawings.

DESCRIPTION OF THE PREFERRED EMBODIMENTS

First Embodiment

Figure 1:
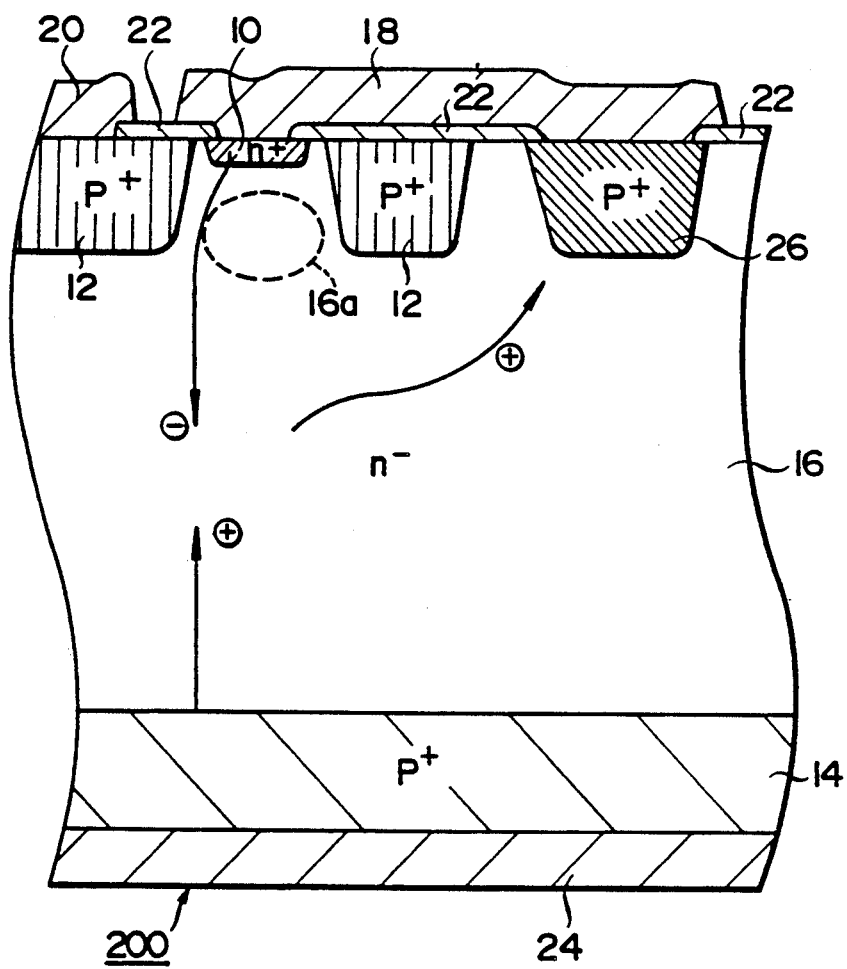
FIG. 1 is a sectional view of a static induction type thyristor in accordance with a first embodiment of the present invention.

FIG. 1 shows a part of the sectional structure of an n-channel type static induction type thyristor 200 which adopts a static induction type semiconductor device of the present invention.

The static induction type thyristor in this embodiment is fabricated in the following way.

The ions of boron are implanted on an n-type silicon substrate having an impurity density of about $1 \times 10^{14} cm^{-3}$ and a thickness of about 250 $\mu$m from one surface of the substrate so as to form P+ gate regions 12 and P+ cathode short regions 26. A P+ anode region 14 is formed by the ion implantation of boron from the other surface. The depth of these P+ regions is about 5 $\mu$m, and the impurity density is about $2 \times 10^{19} cm^{-3}$.

An n+ cathode region is then formed between every two adjacent P+ gate regions 12 by the ion implantation of arsenic. The depth of the n+ cathode regions is about 0.2 $\mu$m and the impurity density thereof is about $1 \times 10^{20} cm^{-3}$.

Thereafter, a first main electrode 18 consisting of an aluminum electrode is disposed so that the cathode region 10 and the cathode short region 26 have the same potential. Similarly, control electrodes 20 and a second main electrode which consist of an aluminum electrode are disposed in the gate region 12 and the anode region 14, respectively. At a portion at which the gate electrode 12 and the first main electrode 18 come into contact with each other, an insulating film 22 is interposed therebetween in order to insulate them from each other.

The operation of this embodiment will be explained in the following. The turn-on operation of the static induction type thyristor 200 is executed by applying a voltage to the gate region 12 so that the gate region 12 has a positive potential with respect to the cathode region 10. A slight change in the potential of the gate region 12 or the injection of a slight number of holes from the gate region 12 to the channel region 16a draws up a larger amount of electron current, thereby making the static induction type thyristor 200 conductive.

In this conductive state, a part of the holes injected from the anode region 14 flow toward the cathode region 10 through the channel region 16a. However, the other many holes flow toward the cathode short region 26 without passing through the channel region 16a. Therefore, the hole density in the channel region 16a becomes lower than that of the static induction type thyristor 100 which does not have the cathode short region 26.

The turn-off operation of the static induction type thyristor 200 is executed by making the potential of the gate region 12 0 V or a negative potential so as to draw up the holes in the channel region 16a to the gate region 12 and heighten the potential of the gate region 12 with respect to the electrons in the channel region 16a, thereby stopping the injection of the electrons from the cathode region 10.

The static induction type thyristor 200 of this embodiment has a low hole density in the channel region 16a, as described above. It is therefore possible to quickly break the conduction of, namely, turn off the static induction type thyristor 200.

Figure 2:
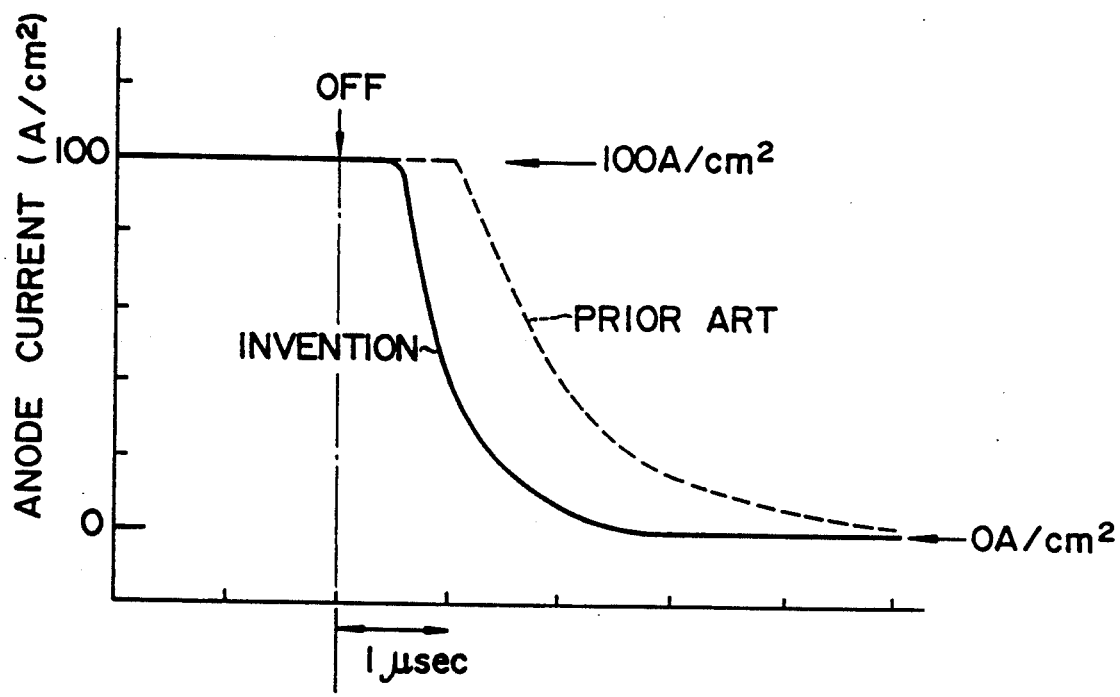
FIG. 2 is a characteristic curve showing the current cutting off operation of the first embodiment.

FIG. 2 shows an example of the turn-off characteristics of the anode currents of the static induction type thyristor 200 of this embodiment and the conventional static induction type thyristor 100.

The voltage drops of both static induction type thyristors 100 and 200 at the time of conduction, namely, the forward voltage drops are about 1.2 V at a current density of 100 A/cm$^2$, but the static induction type thyristor 200 of this embodiment has a more excellent turn-off characteristic than the conventional static induction type thyristor 100.

That is, the period from the time when an OFF signal is input so as to make the potential of the gate region 12 0 V or a negative potential to the time at which the current begins to decrease, namely, the storage time of the static induction type thyristor 200 is about 500 nsec while the storage time of the conventional static induction type thyristor 100 is 1 μsec. In other words, the storage time of the static induction type thyristor 200 is shortened to about ½ of that of the conventional static induction type thyristor 100.

The period from the time an OFF signal is input to the time at which the current begins to decrease (hereinunder referred to as "fall time") is also shortened to a great extent. The area of the static induction type thyristor 200 of this embodiment at which the cathode short region 26 is in contact with the low impurity density region 16 is about 370% with respect to the area at which the cathode region 10 is in contact with the low impurity, density region 16. A 5 mm×5 mm chip of the static induction type thyristor 200 is provided with about 1,000 cathode short regions 26 and about 16,000 cathode regions 10.

From the investigation on the ratio of the area of the cathode short regions 26 to the area of the cathode regions 10, it has been found that making the area of the cathode short regions 26 larger than the area of the cathode regions 10 enables sufficiently high-speed operation. It has also been found that if the distance between the cathode region 10 and the cathode short region 26 is made shorter than the distance between the cathode region 10 and the anode region 14, it is possible to effectively reduce the hole density in the channel region 16a.

Second Embodiment

Figure 3:
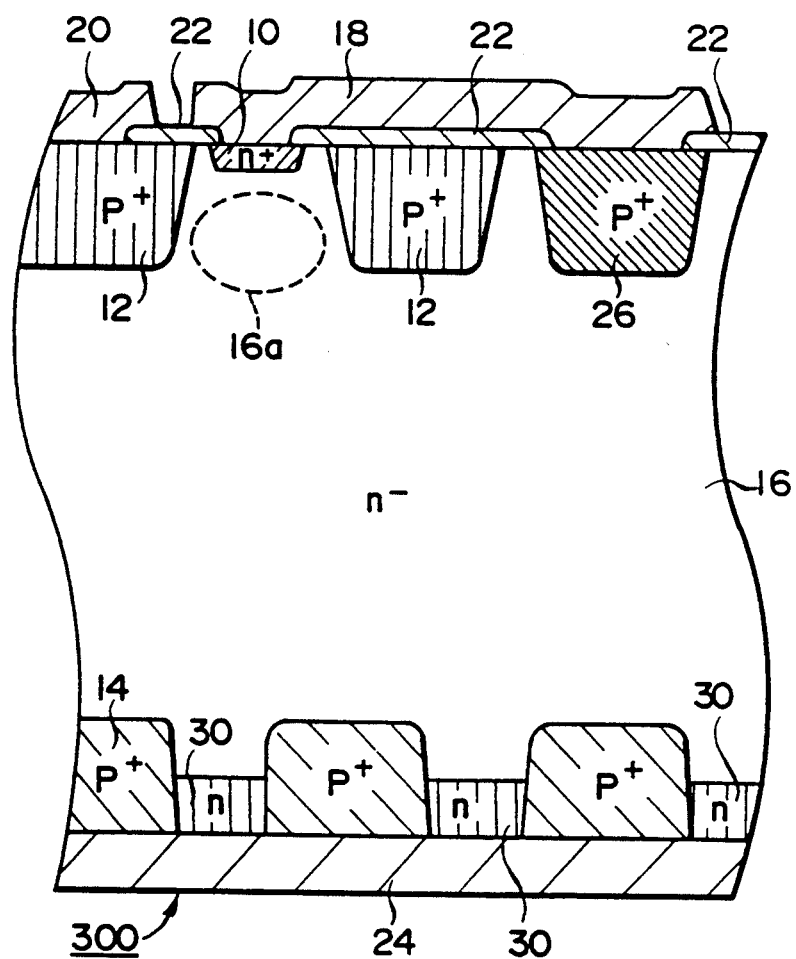
FIG. 3 is a sectional view of a static induction type thyristor in accordance with a second embodiment of the present invention.

FIG. 3 shows an n-channel type static induction type thyristor 300 which has an anode short structure and adopts a static induction type semiconductor device of the present invention.

This embodiment is the same as the first embodiment except for the anode region 14 and an anode short region 30.

In the static induction type thyristor 300 having an anode short structure, the electrons flow toward the anode short region 30, so that the injection efficiency of the holes from the anode region 14 is reduced. In addition, since the electrons flow smoothly at the front portion of the anode region 14 in the turn-off process, the fall time of the anode current is shortened.

Since the hole density in the channel region 16a is low as the first embodiment, the storage time is short. The short storage time as well as the formation of the anode short region 30 in the third embodiment brings about a high-speed turn-off characteristic.

Figure 4:
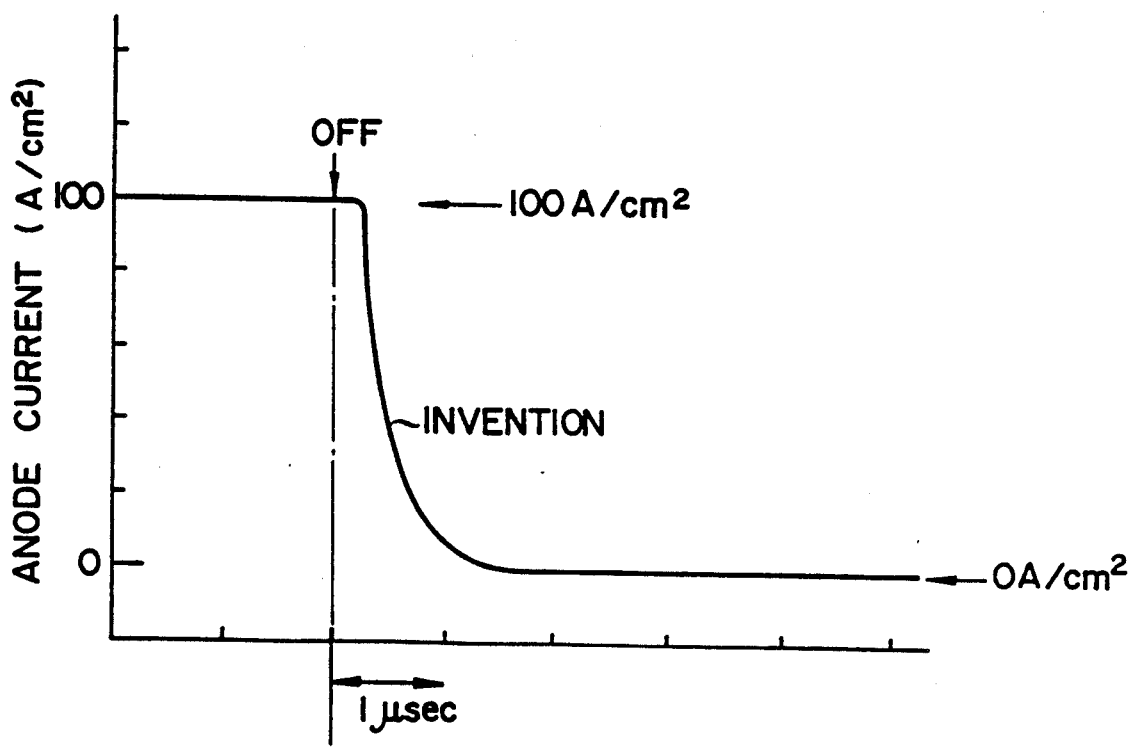
FIG. 4 is a characteristic curve showing the current cutting off operation of the second embodiment.

FIG. 4 shows the turn-off characteristic of the static induction type thyristor 300 of the second embodiment. The storage time of this embodiment is 400 nsec and the fall time thereof is 800 nsec. These values are about ½ of the values in a conventional thyristor.

The structure of the static induction type thyristor 300 of this embodiment is the same as that of the thyristor used in FIG. 2 except for the structure on the anode side. The area of the cathode short regions 26 is 370% of the area of the cathode regions 10. The area of the anode short regions 30 is about 33% of the area of the anode regions 14.

The forward voltage drop in this embodiment was about 1.3 V at a current density of 100 A/cm$^2$.

Third Embodiment

Figure 5:
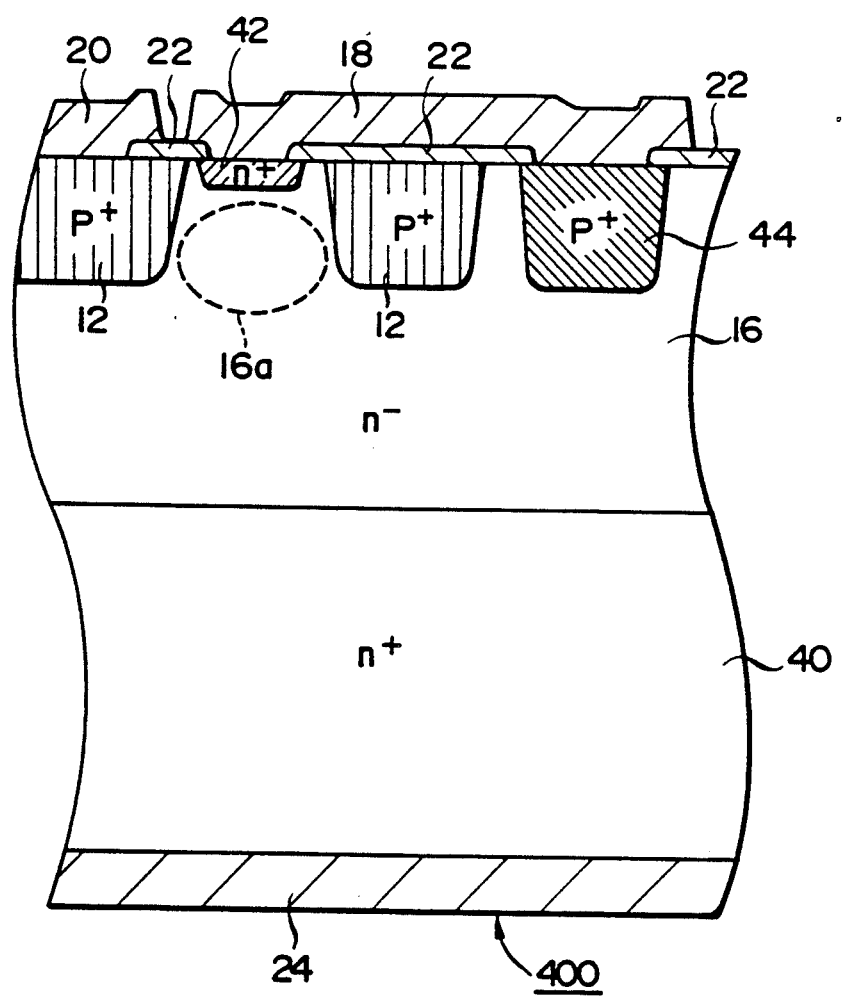
FIG. 5 is a sectional view of a normally-off static induction type transistor in accordance with a third embodiment of the present invention.

FIG. 5 shows an n-channel normally-off static induction type transistor 400 which adopts a static induction type semiconductor device of the present invention.

The normally-off static induction type transistor 400 is fabricated in the following way.

The low impurity density region 16 of about 35 μm thick is formed by epitaxial growth on an n-type silicon substrate which is to be an n$^+$ drain region 40 having an impurity density of about $2\times10^{18}$cm$^{-3}$ and a thickness of about 400 μm. From the surface of the low impurity density region 16, the ions of boron are implanted so as to form P$^+$ gate regions 12 and P$^+$ source short regions 44. From the same surface, n$^+$ source regions 42 are formed by the ion implantation of arsenic. Thereafter, the first main electrode 18 is disposed in the source short region 44 and the source region 42, the control electrode 20 is disposed in the gate electrode 12 and the second main electrode 24 is disposed in the drain region 40 in the same way as in the first embodiment. The insulating film 22 is interposed between the first main electrode 18 and the gate electrode 12.

The turn-on operation of the normally-off static induction type transistor 400 is executed by applying a voltage to the gate region 12 so that the gate region 12 has a positive potential with respect to the source region 42. The holes are injected from the gate region 12 to the channel region 16a, whereby the electrons are drawn up from the source region 42 and caused to flow to the drain region 40. Thus, the normally-off static induction type transistor 400 is turned on.

In the turn-on operation, the number of the holes injected from the gate region 12 may be not more than 1/10 of the number of the electrons which are drawn up from the source region 42, because the current amplification factor of the normally-off static induction type transistor 400 is large. However, the number of the injected holes is ordinarily made about 1/10 to 1/5 for the purpose of realizing a high-speed turn-on operation.

The turn-off operation of the normally-off static induction type transistor 400 is executed by making the potential of the gate region 12 0 V or a negative potential so as to draw up the holes injected to the channel region 16a to the gate region 12 and stop the injection of the electrons from the source 42.

In the third embodiment, the holes injected from the gate region 12 are distributed not only to the channel region 16a but also to the vicinity of the source short region 44 in the conductive state, so that the hole density in the channel region becomes low.

Therefore, the holes are easily drawn from the channel region 16a in the turn-off process, and the injection of the electrons from the source region 42 is stopped in a short time. Thus, the storage time in the turn-off process becomes short, thereby enabling high-speed operation.

Figure 6:
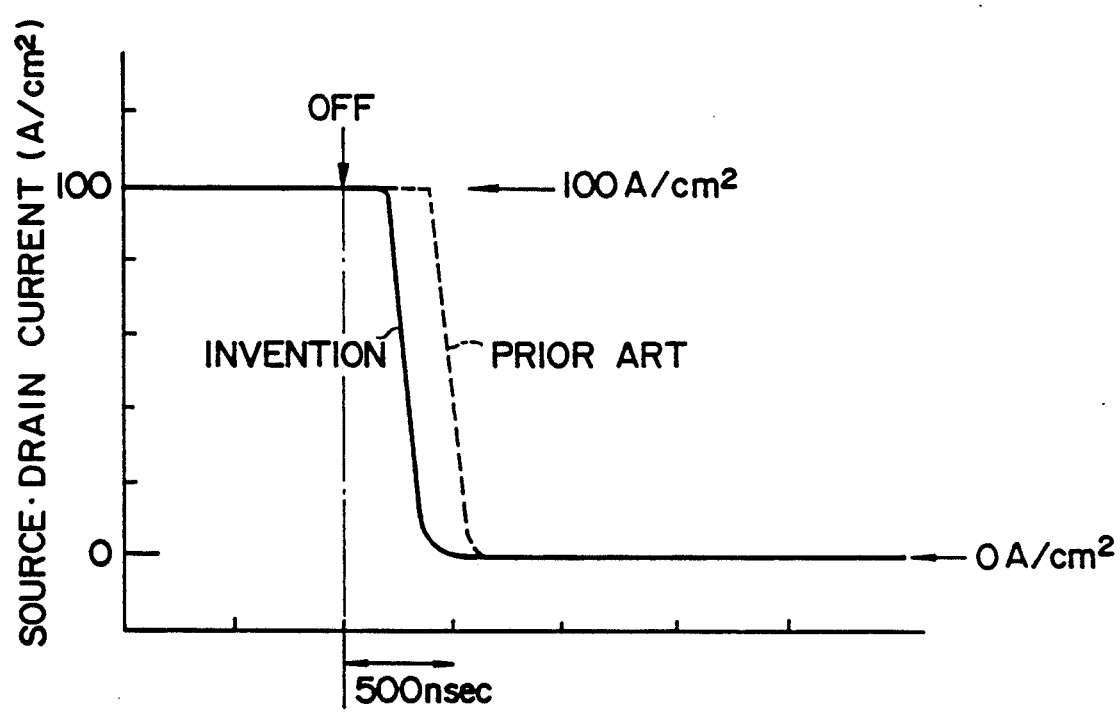
FIG. 6 is a characteristic curve showing the current cutting off operation of the third embodiment.
Figure 7:
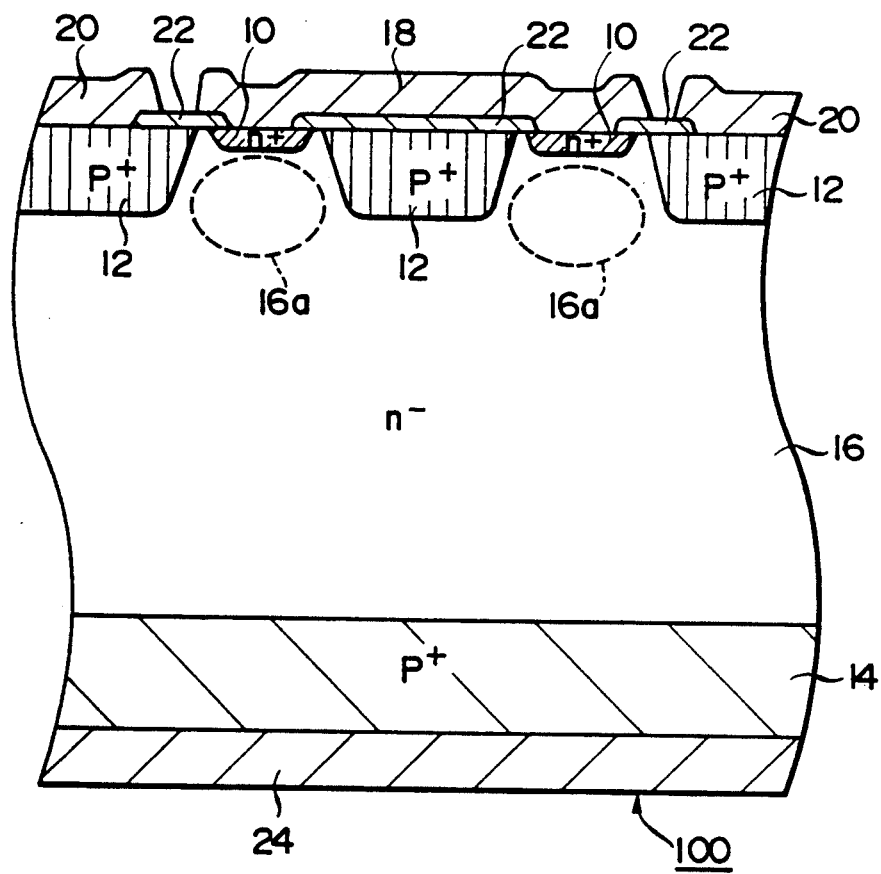
FIG. 7 is sectional view of a static induction type thyristor, which is an example of a conventional static induction type semiconductor device.

FIG. 6 shows the turn-off characteristics of the normally-off static injection type transistor 400 and a conventional normally-off static injection type transistor which does not have a source short region. As is clear from FIG. 6, according to this embodiment, the storage time at the time of turn-off is 200 nsec, namely, about ½ of that of the conventional transistor. The forward voltage drop is 0.21 V at a current density of 100 A/cm², only slightly higher than the forward voltage stop 0.17 V in the conventional transistor.

In addition, the amount of charge drawn up through the gate region 12 in the turn-off process is reduced to not more than half of that in the conventional transistor. Therefore, the driving circuit of the normally-off static injection type transistor 400 is simplified, and high-speed operation is enabled.

The area ratio of the source short region 44 to the source region 42 of the nomrally-off static injection type transistor 400 used in FIG. 6 is about 370%.

The present invention is not restricted to these embodiments and various modifications are possible.

For example, only n-channel static induction type semiconductor devices are explained in the above-described embodiments, but the present invention is also effectively applicable to a p-channel static induction type semiconductor device.

Not only silicon but also gallium-arsenide and the like are usable for a semiconductor substrate. The method of forming each region and the kind of the impurities may be replaced by others ordinarily used in the fabrication of a semiconductor device.

The dimension of each region end the density of the impurities may be varied in accordance with the purpose. In addition, the impurity density in the low impurity density region may have a predetermined distribution in the direction in which the main current flows.

The present invention can also be effectively applied to a normally-on static induction type semiconductor device in which current flows when the potentials of the control electrode and the first main electrode are at the same level.

As described above, according to the present invention, it is possible to obtain a static induction type semiconductor device which is capable of high-speed operation without adding a life time killer.

What is claimed is:

1. A static induction type semiconductor device comprising:
   an anode region which is composed of a first conductivity type semiconductor device and provided at one surface portion of a semiconductor substrate;
   a cathode region which is composed of a second conductivity type semiconductor and provided at the other surface portion of said semiconductor substrate;
   a cathode short region which is composed of said first conductivity type semiconductor and provided at the other surface portion of said semiconductor substrate;
   a gate region which is composed of said first conductivity type semiconductor and provided between said cathode region and said cathode short region;
   a low impurity density region provided at an intermediate portion of said semiconductor substrate;
   a first main electrode conducted to said cathode region and said cathode short region;
   a second main electrode conducted to said anode region; and
   a control electrode conducted to said gate region.

2. A static induction type semiconductor device comprising:
   an anode region which is composed of a first conductivity type semiconductor device and provided at one surface portion of a semiconductor substrate;
   an anode short region which is composed of a second conductivity type semiconductor and provided in the vicinity of said anode region;
   a cathode region which is composed of said second conductivity type semiconductor and provided at the other surface portion of said semiconductor substrate;
   a cathode short region which is composed of said first conductivity type semiconductor and provided at the other surface portion of said semiconductor substrate;
   a gate region which is composed of said first conductivity type semiconductor and provided between said cathode region and said cathode short region;
   a low impurity density region provided at an intermediate portion of said semiconductor substrate;
   a first main electrode conducted to said cathode region and said cathode short region;
   a second main electrode conducted to said anode region and said anode short region; and
   a control electrode conducted to said gate region.

3. A static induction type semiconductor device according to either of claims 1 or 2, wherein the distance between said cathode region and said cathode short region is shorter than the distance between said cathode region and said anode region.

4. A static induction type semiconductor device according to claim 3, wherein the area at which said cathode short region is in contact with said low impurity density region is larger than the area at which said cathode region is in contact with said low impurity density region.

5. A static induction type semiconductor device comprising:
   a P+ anode region which is provided over the entire region of one surface portion of an n-type silicon semiconductor substrate;
   a multiplicity of n+ cathode regions which are provided sporadically at the other surface portion of said n-type silicon semiconductor substrate;
   a P+ cathode short region which is provided at the other surface portion of said n-type silicon semiconductor substrate;
   P+ gate regions which are provided between said n+ cathode region and said P+ cathode short region such that the distance between said n+ cathode region and said P+ cathode short region is shorter than the distance between said n+ cathode region and said P+ anode region;
   a low impurity density region provided at an intermediate portion of said n-type silicon semiconductor substrate;
   a first main electrode conducted to said n+ cathode region and said P+ cathode short region so that said n+ cathode region and said P+ cathode short region have the same potential;
   a second main electrode conducted to said P+ anode region; and
   a control electrode conducted to said P+ gate region; wherein the area at which said P+ cathode short region is in contact with said low impurity density region is sufficiently larger than the area at which said n+ cathode region is in contact with said low impurity density region;

the turn-on operation of said static induction type semiconductor device is executed by applying a voltage to said P+ gate region so that said P+ gate region has a positive potential with respect to said n+ cathode region, and in the conductive state a part of the holes injected from said P+ region flow toward said n+ cathode region through a channel region between said P+ gate region and n+ cathode region, while the other many holes flow directly toward said P+ cathode short region, thereby lowering the hole density in said channel region; and the turn-off operation of said static induction type semiconductor device is executed by making the potential of said P+ gate region 0 or a negative potential so as to draw up the holes in said channel region to said P+ gate region, thereby stopping the injection of the electrons from said n+ cathode region.

6. A static induction type semiconductor device comprising:

a P+ anode region which is provided at one surface portion of an n-type silicon semiconductor substrate;

an n-type anode short region which is provided adjacently to said P+ anode region;

a multiplicity of n+ cathode regions which are provided sporadically at the other surface portion of said n-type silicon semiconductor substrate;

a P+ cathode short region which is provided at the other surface portion of said n-type silicon semiconductor substrate;

P+ gate regions which are provided between said n+ cathode region and said P+ cathode short region such that the distance between said n+ cathode region and said P+ cathode short region is shorter than the distance between said n+ cathode region and said P+ anode region;

a low impurity density region provided at an intermediate portion of said n-type silicon semiconductor substrate;

a first main electrode conducted to said n+ cathode region and said P+ cathode short region so that said n+ cathode region and said P+ cathode short region have the same potential;

a second main electrode conducted to said P+ anode region and said n-type anode short region; and a control electrode conducted to said P+ gate region;

wherein the area at which said P+ cathode short region is in contact with said low impurity density region is sufficiently larger than the area at which said n+ cathode region is in contact with said low impurity density region;

the turn-on operation of said static induction type semiconductor device is executed by applying a voltage to said P+ gate region so that said P+ gate region has a positive potential with respect to said n+ cathode region, and in the conductive state a part of the holes injected from said P+ anode region flow toward n+ cathode region through a channel region between said P+ gate region and n+ cathode region, while the other many holes flow directly toward said P+ cathode short region, thereby lowering the hole density in said channel region;

the turn-off operation of said static induction type semiconductor device is executed by making the potential of said P+ gate region 0 or a negative potential so as to draw up the holes in said channel region to said P+ gate region, thereby stopping the injection of the electrons from said n+ cathode region; and said n-type anode short region encourages said holes in said channel region to be drawn up during said turn-off operation.

7. A static induction type semiconductor device comprising:

an n+ drain region which is composed of a second conductivity type semiconductor device and provided at one surface portion of an n-type semiconductor substrate;

an n+ source region which is composed of said second conductivity type semiconductor and provided at the other surface portion of said semiconductor substrate;

a P+ source short region which is composed of said first conductivity type semiconductor and provided at the other surface portion of said semiconductor substrate;

a P+ gate region which is composed of said first conductivity type semiconductor and provided between said n+ source region and said P+ source short region;

a low impurity density region provided at an intermediate portion of said semiconductor substrate;

a first main electrode conducted to said source region and said source short region;

a second main electrode conducted to said drain region; and a control electrode conducted to said gate region.

8. A static induction type semiconductor device according to claim 7, wherein the distance between said source region and said source short region is shorter than the distance between said source region and said drain region.

9. An n-channel normally-off static induction type semiconductor device comprising:

an n+ drain region which is provided over the entire region of one surface portion of an n-type silicon semiconductor substrate;

a multiplicity of n+ source regions which are provided sporadically at the other surface portion of said n-type silicon semiconductor substrate;

a P+ source short region which is provided at the other surface portion of said n-type silicon semiconductor substrate;

P+ gate regions which are provided between said n+ source regions and said P+ source short region;

a low impurity density region provided at an intermediate portion of said n-type silicon semiconductor substrate;

a first main electrode conducted to said n+ source region and said P+ source short region so that said n+ source region and said P+ source short region have the same potential;

a second main electrode conducted to said n+ drain region; and a control electrode conducted to said P+ gate region;

where the area at which said P+ source short region is in contact with said low impurity density region is larger than the area at which said n+ source region is in contact with said low impurity density region;

the turn-on operation of said static induction type semiconductor device is executed by applying a voltage to said P+ gate region so that said P+ gate region has a positive potential with respect to said n+ source region, and in the conductive state the holes injected from said P+ gate region are distributed not only to a channel region between said P+ gate region and said n+ source region but also to the vicinity of said P+ source short region, thereby lowering the hole density in said channel region; and the turn-off operation of said static induction type semiconductor device is executed by making the potential of said P+ gate region 0 or a negative potential so as to draw up the holes in said channel region to said P+ gate region, thereby stopping the injection of the electrons from said n+ source region.

* * * * *